(12) United States Patent
Park

(10) Patent No.: US 8,013,627 B2
(45) Date of Patent: Sep. 6, 2011

(54) SEMICONDUCTOR DEVICE AND METHOD OF FABRICATING THE SAME

(75) Inventor: Bong-Il Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,722

(22) Filed: Dec. 30, 2009

(65) Prior Publication Data
US 2010/0164537 A1    Jul. 1, 2010

(30) Foreign Application Priority Data
Dec. 31, 2008    (KR) .................. 10-2008-0138714

(51) Int. Cl.
*H03K 19/003* (2006.01)

(52) U.S. Cl. .......................................... 326/10; 326/13

(58) Field of Classification Search .................... 326/10, 326/13, 41, 47
See application file for complete search history.

(56) References Cited

U.S. PATENT DOCUMENTS

| 6,404,226 B1 * | 6/2002 | Schadt ........................... 326/41 |
| 6,781,170 B2 * | 8/2004 | Cebenko et al. .............. 257/292 |
| 2002/0163354 A1 * | 11/2002 | Bingert et al. .................. 326/10 |

FOREIGN PATENT DOCUMENTS

| JP | 2006-222303 | 8/2006 |
| JP | 2006-237123 | 9/2006 |
| KR | 10-0698257 | 3/2007 |

* cited by examiner

*Primary Examiner* — Daniel D Chang
(74) *Attorney, Agent, or Firm* — Harness, Dickey & Pierce

(57) ABSTRACT

Provided is a semiconductor device and a method of fabricating the same. The semiconductor device may include at least one logic circuit and at least one spare circuit. The at least one spare circuit may be that is a substitute for the at least one logic circuit and may not be connected to a power voltage source and/or a ground voltage source.

10 Claims, 4 Drawing Sheets

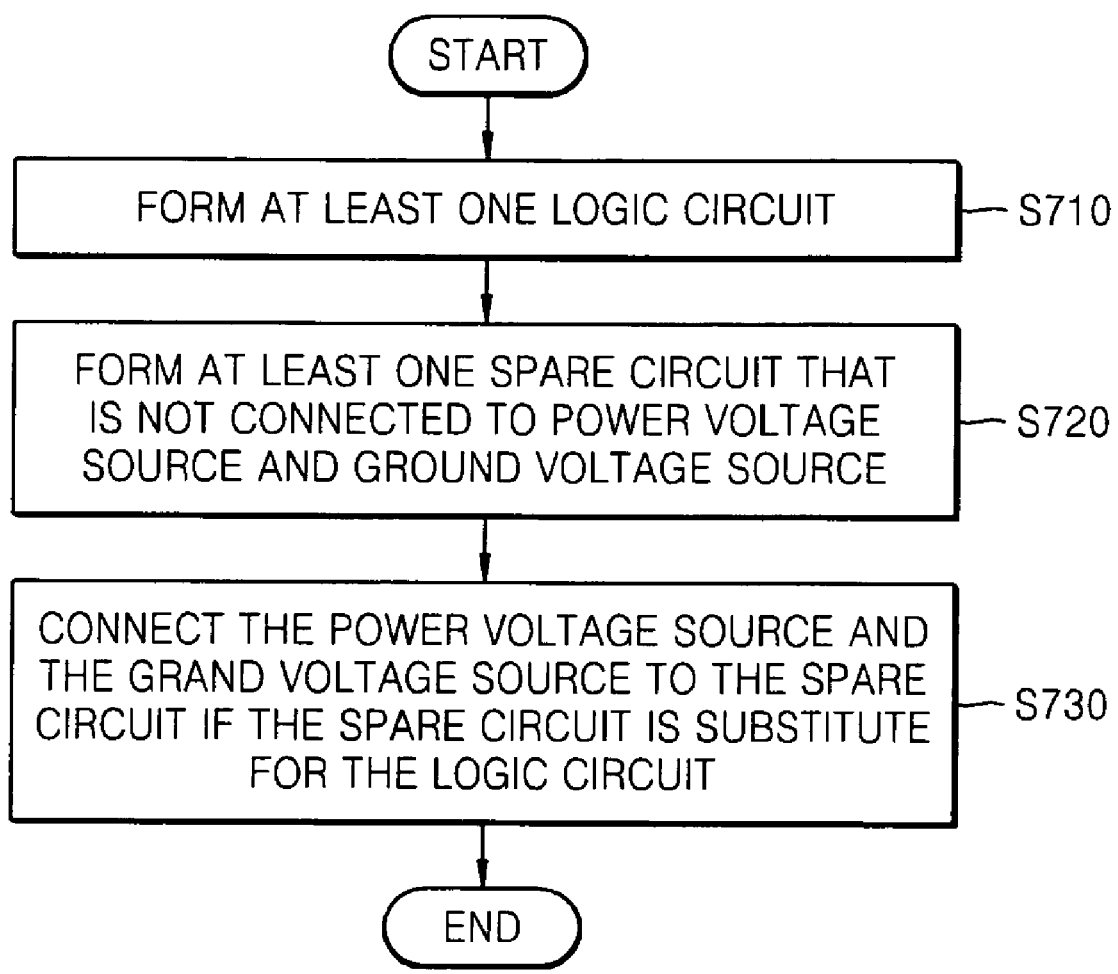

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2008-0138714, filed on Dec. 31, 2008, in the Korean Intellectual Property Office, the entire contents of which are incorporated herein by reference.

BACKGROUND

1. Field

Example embodiments relate to a semiconductor device and a method of fabricating the same (e.g., a semiconductor device including a spare circuit and a method of fabricating the same).

2. Description of Conventional Art

Semiconductors are designed prior to fabrication. During the designing stage, an error may be included in a semiconductor design. When such an error occurs in designing a semiconductor device, the error may be removed by adding a transistor to the semiconductor device and/or correcting a connection between an existing transistor and the semiconductor device.

Adding the transistor to the semiconductor device to address a design error may involve correcting many layers, which increases fabricating time and expenses. On the other hand, correcting the connection between the existing transistor and the semiconductor device may require use of a spare circuit previously included in the semiconductor device. However, the number of spare circuits may be limited due to leakage current. Also, if a spare circuit is previously included in the semiconductor device, an additional routing scheme for connecting an input terminal to a ground voltage source may be necessary. Including the additional routing scheme may affect the routing of an existing circuit.

SUMMARY

Example embodiments provide a semiconductor device including at least one logic circuit and at least one spare circuit. The at least one spare circuit may be configured to be a substitute for the at least one logic circuit and to not be connected to a power voltage source and a ground voltage source. In further example embodiments, the at least one spare circuit may be connected to the power voltage source and the ground voltage source if the at least one spare circuit is a substitute for the at least one logic circuit.

According to another example embodiment, a method of fabricating a semiconductor device may include forming at least one logic circuit; and forming at least one spare circuit such that the spare circuit is a substitute for the at least one logic circuit and is not connected to a power voltage source and a ground voltage source. The method may further include, connecting the at least one spare circuit to the power voltage source and the ground voltage source if the at least one spare circuit is a substitute for the at least one logic circuit.

BRIEF DESCRIPTION OF THE DRAWINGS

Example embodiments may be more clearly understood from the following detailed description in conjunction with the accompanying drawings in which:

FIG. 7 is a flowchart illustrating a method of fabricating a semiconductor device according to an example embodiment.

DETAILED DESCRIPTION OF EXAMPLE EMBODIMENTS

Figure 1:
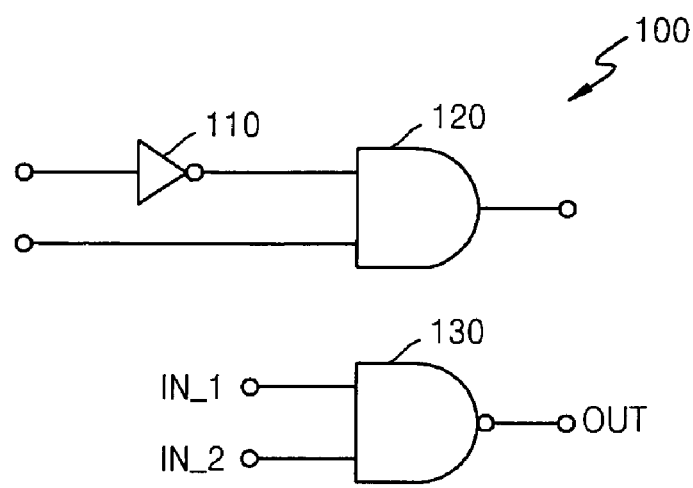
FIG. 1 is a circuit diagram of a semiconductor device according to an example embodiment.

Example embodiments are described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, some example embodiments will be explained in detail with reference to the accompanying drawings.

The Figures illustrate example embodiments, which are referred to in order to gain a sufficient understanding of claimed subject matter, the merits thereof, and the objectives accomplished.

The semiconductor device according to an example embodiment may include at least one logic circuit and/or at least one spare circuit. The logic circuit may be a circuit that is currently used. The spare circuit may be a substitute for the logic circuit when an error occurs in designing the semiconductor device. The logic circuit and the spare circuit may be various types of logic gates, and may include at least one transistor, respectively. Hereinafter, a semiconductor device 100 will now be described with reference to FIG. 1 for descriptive convenience. However, further embodiments are not limited thereto and a different type of logic gate or transistor may be used instead.

FIG. 1 is a circuit diagram of the semiconductor device 100 according to an example embodiment.

Referring to FIG. 1, the semiconductor device 100 includes two logic circuits (logic circuit 110 and logic circuit 120) and a spare circuit 130. The two logic circuits 110 and 120 are connected to each other and are currently used. The spare circuit 130 is not currently used. Hereinafter, the spare circuit 130 is a NAND gate for the descriptive convenience. However, the spare circuit 130 is not limited to the NAND gate.

The spare circuit 130, which is not currently used, is described in more detail with reference to FIG. 2.

Figure 2:
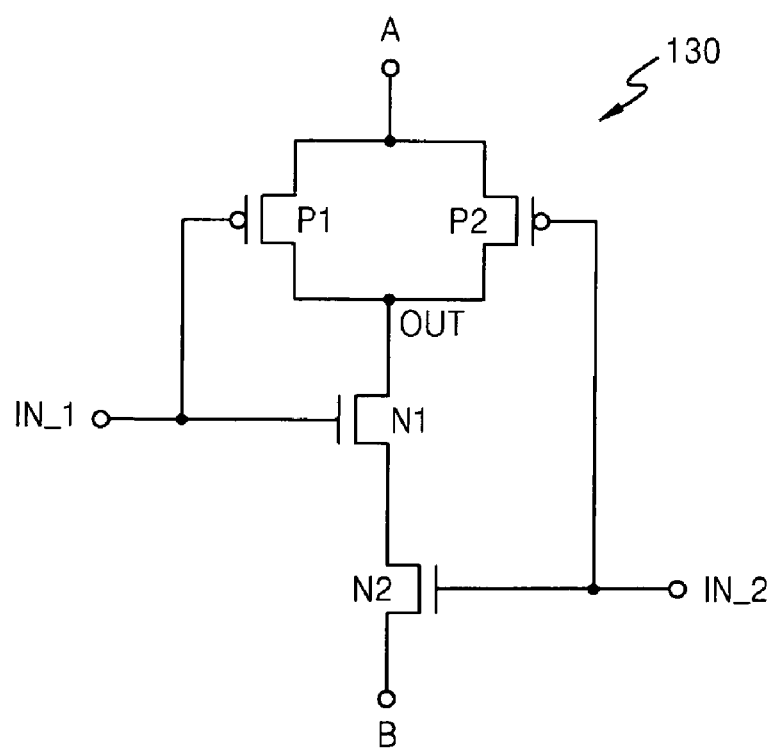
FIG. 2 is a circuit diagram of a spare circuit shown in FIG. 1 according to an example embodiment.

FIG. 2 is a circuit diagram of the spare circuit 130 shown in FIG. 1 according to an example embodiment.

Referring to FIGS. 1 and 2, the spare circuit 130 is a NAND gate that includes first and second PMOS transistors P1 and P2 and first and second NMOS transistors N1 and N2. A first terminal of the first PMOS transistor P1 is connected to a node A, a second terminal thereof is connected to an output terminal OUT of the NAND gate, and a gate thereof is connected to a first input terminal IN_1 of the NAND gate. A first terminal of the second PMOS transistor P2 is connected to the node A, a second terminal thereof is connected to the output terminal OUT of the NAND gate, and the gate thereof is connected to a second input terminal IN_2 of the NAND gate.

A first terminal of the first NMOS transistor Ni is connected to an output terminal OUT of the NAND gate, and a gate thereof is connected to the first input terminal IN_1 of the NAND gate. A first terminal of the second NMOS transistor N2 is connected to a second terminal of the first NMOS transistor, a second terminal thereof is connected to a node B, and a gate thereof is connected to the second input terminal IN_2 of the NAND gate.

To normally operate the NAND gate, a power voltage may be applied to the node A, and a ground voltage may be applied to the node B. However, such a power voltage and ground voltage may not be applied to the spare circuit 130 according to the illustrated example embodiment. More specifically, the first terminals of the first and second PMOS transistors P1 and P2 are not connected to the power voltage source, and the second terminal of the second NMOS transistor N2 is not connected to the ground voltage source. Therefore, if the spare circuit 130 is a NAND gate that is not currently being used, no leakage current may be generated in the first and second PMOS transistors P1 and P2 and the first and second NMOS transistors N1 and N2.

An input terminal of the spare circuit 130 according to the illustrated example embodiment may not be connected to the power voltage source and/or the ground voltage source. For example, during conventional operation, if the spare circuit 130 is a NAND gate, the first and second NMOS transistors N1 and N2 may remain off by applying the ground voltage to the first and second input terminals IN_1 and IN_2. Allowing the first and second NMOS transistors N1 and N2 to remain off minimizes an influence of leakage current. However, even by having NMOS transistors N1 and N2 off by applying ground voltage, leakage current may still be present in the spare circuit 130 based on: (i) flow from gates of the first and second NMOS transistors N1 and N2 to sources and/or drains thereof; and/or (ii) flows from sources thereof to drains thereof. However, the spare circuit 130 of the semiconductor device 100 addresses the leakage current by not being connected to either the power voltage source or the ground voltage source. Thus, no leakage current may be generated by the power voltage source and/or the ground voltage source. Thus, the power voltage source or the ground voltage source is not necessarily connected to the input terminal of the spare circuit 130. More specifically, FIG. 2 illustrates that the first and second input terminals IN_1 and IN_2 of the NAND gate are not connected to the ground voltage source.

Figure 3:
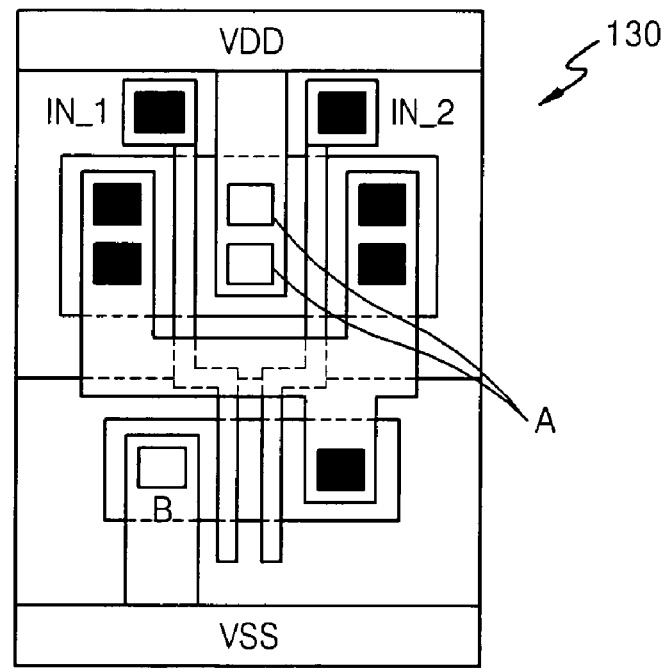
FIG. 3 is a schematic layout diagram of the spare circuit shown in FIG. 2 according to an example embodiment.

FIG. 3 is a schematic layout diagram of the spare circuit 130 shown in FIG. 2 according to an example embodiment.

Referring to FIGS. 1 through 3, no contact is formed on the node A. The lack of a contact in the node A is in order to prevent the node A from being connected to a power voltage source VDD. Also, no contact is formed on the node B. The lack of a contact in node B is in order to prevent the node B from being connected to a ground voltage source VSS. In FIG. 3, a "■" symbol indicates that a contact is formed, whereas a "□" symbol indicates that no contact is formed. In more detail, the spare circuit 130 does not include a contact used to connect the power voltage source VDD and the ground voltage source VSS, so that the spare circuit 130 may not be connected to the power voltage source VDD and/or the ground voltage source VSS.

Figure 4:
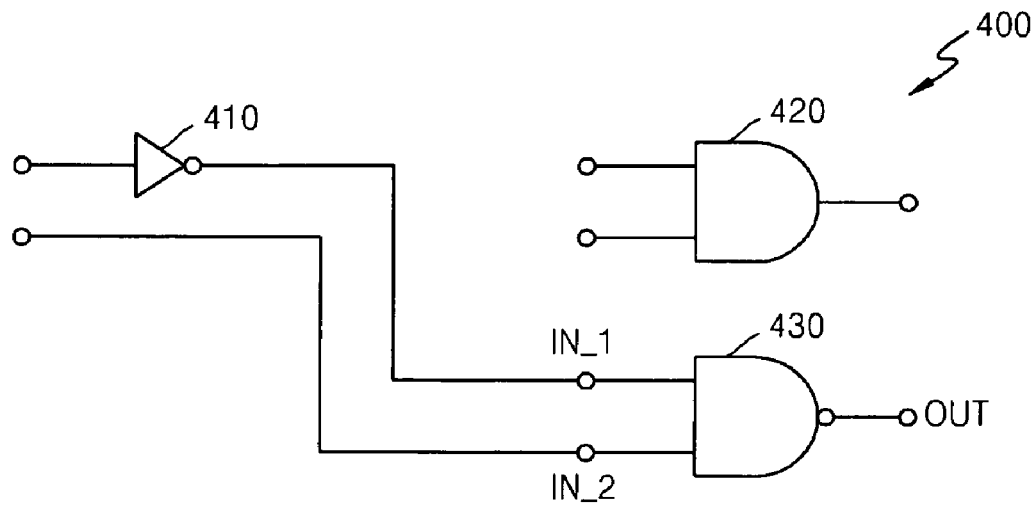
FIG. 4 is a circuit diagram of a semiconductor device when an error is removed by using the spare circuit shown in FIG. 1 according to another example embodiment.

FIG. 4 is a circuit diagram of a semiconductor device 400 when an error is removed by using the spare circuit 130 shown in FIG. 1 according to another example embodiment.

Hereinafter, the spare circuit 130 is a substitute for the logic circuit 120 shown in FIG. 1 due to a design error. Referring to FIG. 4, the semiconductor device 400 is designed by using a NAND gate 430 instead of an AND gate 420. In this case, the NAND gate 430 is connected to a power voltage source and a ground voltage source in order to perform a NAND operation. FIG. 4 illustrates a situation in which the spare circuit 130 of FIG. 1 (NAND gate 430 in FIG. 4) replaces and/or substitutes the logic circuit 120 of FIG. 2 (AND gate 420 in FIG. 4.). In such a situation, the power voltage source and/or the ground voltage source are connected to the spare circuit 130 (NAND gate 430 in FIG. 4).

Figure 5:
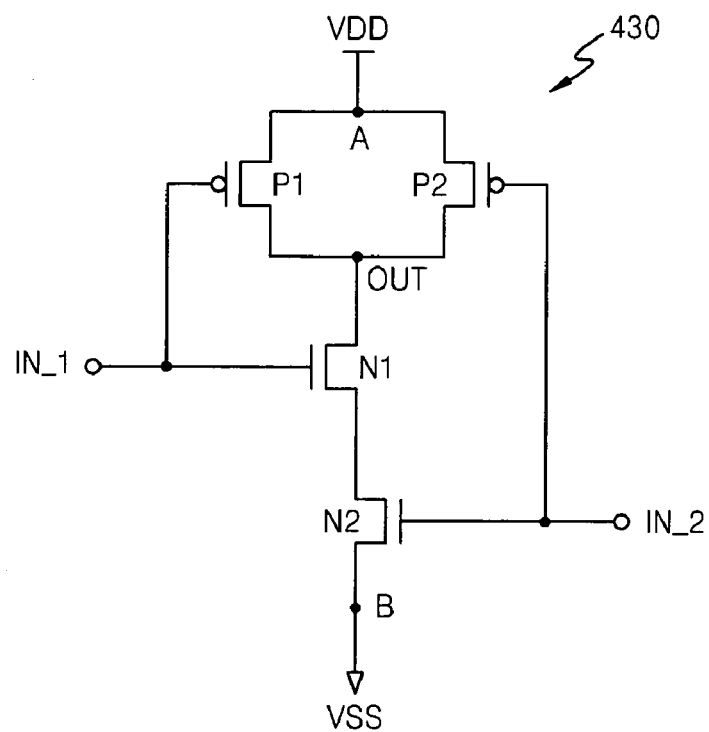
FIG. 5 is a circuit diagram of a NAND gate shown in FIG. 4 according to another example embodiment.

FIG. 5 is a circuit diagram of the NAND gate 430 shown in FIG. 4 according to another example embodiment.

In comparison of the spare circuit 130 shown in FIG. 2 and the NAND gate 430 of the present embodiment, a node A of the NAND gate 430 is connected to the power voltage source VDD and a node B thereof is connected to the ground voltage source VSS. Thus, makeup of the NAND gate 430 may allow normal operation of the NAND gate 430.

Figure 6:
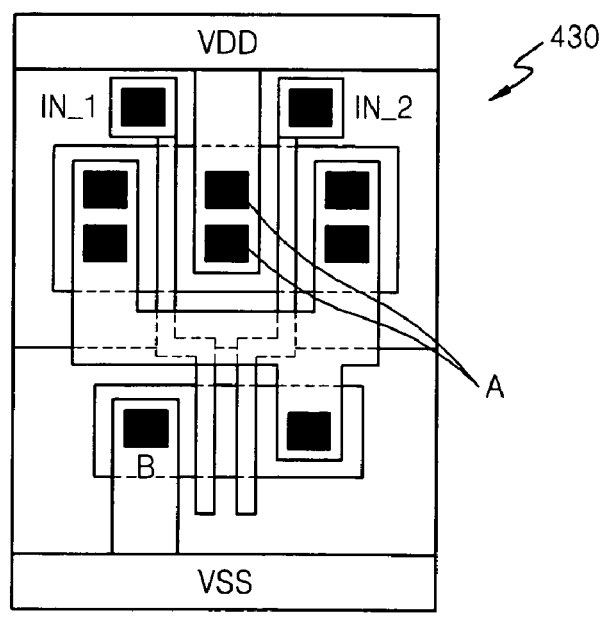
FIG. 6 is a schematic layout diagram of the NAND gate shown in FIG. 4 according to another example embodiment.

FIG. 6 is a schematic layout diagram of the NAND gate 430 shown in FIG. 4 according to another example embodiment.

Unlike the circuit 130 shown in FIG. 3, contacts in the NAND gate 430 are formed (i) between a node A and the power voltage source VDD and (ii) between a node B and the ground voltage source VSS. More specifically, the NAND gate 430 illustrates how the spare circuit 130 may be connected. As discussed above, the power voltage source VDD and the ground voltage source VSS of the spare circuit 130 are not connected. However, the spare circuit 130 may be connected to the power voltage source VDD and the ground voltage source VSS by simply forming the contacts in nodes A and B similar to NAND gate 430.

According to example embodiments, a spare circuit is a NAND gate. However, as described above, the spare circuit is not limited to the NAND gate. When the spare circuit, including at least one logic device or at least one transistor, performs a logic operation, leakage current may be removed in the same manner as described above.

FIG. 7 is a flowchart illustrating a method of fabricating a semiconductor device according to an example embodiment.

Referring to FIG. 7, the method of fabricating the semiconductor device may include an operation 710 of forming at least one logic circuit and an operation 720 of forming at least one spare circuit. In operation 720, the spare circuit may not be connected to a power voltage source and a ground voltage source. To prevent the spare circuit from being connected to the power voltage source and the ground voltage source, no connection is made with a contact of the spare circuit used to connect to the power voltage source and the ground voltage source. Also, a plurality of transistors included in the spare circuit may not be connected to the power voltage source and the ground voltage source. Also in operation 720, an input terminal of the spare circuit may not be connected to the power voltage source and the ground voltage source.

The method of fabricating the semiconductor device may further include an operation 730 of connecting the power voltage source and the ground voltage source to the spare circuit if the spare circuit is a substitute for the logic circuit.

While the discussed subject matter has been described with reference to example embodiments, it will be understood that various changes in form and details may be made therein without departing from the spirit and scope of the following claims.

What is claimed is:

1. A semiconductor device comprising:
    at least one logic circuit; and
    at least one spare circuit configured to be a substitute for the at least one logic circuit and is not connected to a power voltage source and a ground voltage source, wherein the at least one spare circuit does not include a contact connecting the power voltage source and the ground voltage source to the at least one spare circuit.

2. The semiconductor device of claim 1, wherein the at least one spare circuit comprises at least one transistor that is not connected to the power voltage source and the ground voltage source.

3. The semiconductor device of claim 1, wherein an input terminal of the at least one spare circuit is not connected to the power voltage source and the ground voltage source.

4. The semiconductor device of claim 1, wherein the at least one spare circuit is connected to the power voltage source and the ground voltage source if the at least one spare circuit is a substitute for the at least one logic circuit.

5. The semiconductor device of claim 1, wherein at least one spare circuit is a NAND gate.

6. The semiconductor device of claim 1, wherein the NAND gate includes at least one of NMOS transistors and PMOS transistors.

7. A method of fabricating a semiconductor device, the method comprising:
    forming at least one logic circuit; and
    forming at least one spare circuit, such that the at least one spare circuit is a substitute for the at least one logic circuit and is not connected to a power voltage source and a ground voltage source, and the forming of the at least one spare circuit includes forming the at least one spare circuit without contacts connecting the power voltage source and the ground voltage source to the at least one spare circuit.

8. The method of claim 7, wherein the forming of the at least one spare circuit comprises:
    forming at least one transistor that is not connected to the power voltage source and the ground voltage source.

9. The method of claim 7, wherein, in the forming of the at least one spare circuit step, an input terminal of the at least one spare circuit is not connected to the power voltage source and the ground voltage source.

10. The method of claim 7, further comprising:
    connecting the at least one spare circuit to the power voltage source and the ground voltage source if the at least one spare circuit is a substitute for the at least one logic circuit.

* * * * *